US009541605B1

United States Patent
Kothandaraman (10) Patent No.: US 9,541,605 B1
(45) Date of Patent: Jan. 10, 2017

(54) MAGNETIC TUNNEL JUNCTION LOADED RING OSCILLATORS FOR MRAM CHARACTERIZATION

(71) Applicant: International Business Machines Corporation, Armonk, NY (US)

(72) Inventor: Chandrasekharan Kothandaraman, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/969,659

(22) Filed: Dec. 15, 2015

(51) Int. Cl.
- *G01R 27/28* (2006.01)
- *G01R 31/327* (2006.01)
- *H03K 3/03* (2006.01)
- *G01R 31/28* (2006.01)

(52) U.S. Cl.
CPC ....... *G01R 31/3278* (2013.01); *G01R 31/2882* (2013.01); *H03K 3/0315* (2013.01)

(58) Field of Classification Search
CPC .............. G01R 31/31937; G01R 27/28; G01R 31/31725; G01R 31/3016; H04B 3/462
See application file for complete search history.

(56) References Cited

U.S. PATENT DOCUMENTS

| | | | |
|---|---|---|---|
| 4,910,471 A | 3/1990 | Brahmbhatt et al. | |
| 6,774,734 B2 | 8/2004 | Christensen et al. | |
| 6,950,334 B2 | 9/2005 | Shimizu et al. | |
| 7,414,904 B2 | 8/2008 | Ehrenreich et al. | |
| 7,619,431 B2 * | 11/2009 | De Wilde | G01R 15/20 324/750.3 |
| 7,760,565 B2 | 7/2010 | Kuang et al. | |
| 8,164,966 B2 | 4/2012 | Stratz et al. | |
| 8,923,073 B2 | 12/2014 | Brooks | |
| 9,135,975 B2 * | 9/2015 | Kim | G11C 11/1675 |

(Continued)

OTHER PUBLICATIONS

Fredman et al., "Complementary magnetic tunnel junction logic." IEEE Transactions on Electron Devices, vol. 61, No. 4, 2014, pp. 1207-1210.

(Continued)

*Primary Examiner* — Jermele M Hollington
*Assistant Examiner* — Suresh K Rajaputra
(74) *Attorney, Agent, or Firm* — Cantor Colburn LLP; Vazken Alexanian (57) ABSTRACT

Circuits are provided for modeling and characterizing the switching of magnetic tunnel junctions (MTJ) elements. More specifically, ring oscillators loaded with MTJ elements are used to characterize magnetic tunnel junction (MTJ) element performance. The circuits can include a ring oscillator (RO) having an odd number of inverters connected in series with a magnetic tunnel junction (MTJ) element inserted between each inverter. In some embodiments, the magnetic tunnel junction (MTJ) elements are arranged to act as a load to the inverters. The circuits optionally include one or more of a time to amplitude converter, a pulse distribution analyzer and/or PFET(s) and NFET(s). Methods of characterizing the switching characteristics of MTJ elements are also provided herein. Such MTJ elements can be suitable for use in magnetoresistive random access memory (MRAM) devices. Methods of making the ring oscillator are further provided herein.

20 Claims, 2 Drawing Sheets

(56) References Cited

U.S. PATENT DOCUMENTS

| | | | | |
|---|---|---|---|---|
| 2005/0083748 | A1* | 4/2005 | Lemus | G11C 11/16 |
| | | | | 365/210.1 |
| 2010/0171530 | A1* | 7/2010 | Deppe | G04F 10/10 |
| | | | | 327/102 |
| 2010/0290281 | A1* | 11/2010 | Kim | G11C 11/16 |
| | | | | 365/171 |
| 2012/0236672 | A1* | 9/2012 | Lee | H02M 1/15 |
| | | | | 365/226 |
| 2013/0106478 | A1* | 5/2013 | Moon | H03L 7/0814 |
| | | | | 327/161 |
| 2013/0300509 | A1* | 11/2013 | Kim | H03L 7/00 |
| | | | | 331/34 |
| 2015/0091111 | A1* | 4/2015 | Friedman | H01L 27/22 |
| | | | | 257/421 |

OTHER PUBLICATIONS

Leem et al., "Magnetic coupled spin-torque devices and magnetic ring oscillator." IEEE International Electron Devices Meeting, IEDM, 2008, 4 pages.

* cited by examiner

MAGNETIC TUNNEL JUNCTION LOADED RING OSCILLATORS FOR MRAM CHARACTERIZATION

BACKGROUND

The present invention generally relates to characterization for magnetoresistive random access memory (MRAM) devices, and more specifically, to the characterization of the performance of magnetic tunnel junction (MTJ) elements loaded in ring oscillators.

Magnetic random access memory (MRAM) devices include magnetic memory elements. The memory elements in MRAM devices include magnetic tunnel junction (MTJ) devices that can store data.

The magnetic device combined with microelectronics in MRAM allows for the design, manufacture and use of non-volatile memory devices. These devices can also be high speed operative devices. MRAM devices can be advantageous relative to other memory technologies such as dynamic random access memory (DRAM), static random access memory (SRAM) and Flash for several reasons. For example, MRAM devices can be non-volatile and consequently retain data even when completely turned off, thereby allowing system power savings. MRAM devices can also be cost effective due to the cell size of such devices. In some instances, MRAM also uses less energy for write characteristics and can possess a faster write cycle relative to some other memory technologies. MRAM devices can further provide the advantage of having unlimited endurance given that the devices do not typically deteriorate. MRAM devices can further be easily integrated with complementary metal oxide semiconductor (CMOS) technologies.

A technique long used to characterize performance of circuits on semiconductor chips is to place a number of the circuits in a ring oscillator (RO). Ring oscillators (ROs) typically include a series of devices or stages connected together to form a ring with a feedback path provided from the output of the last of the series of devices to an input of the first device in the series of devices. The devices may include logic gates, inverters, differential buffers, or differential amplifiers, for example. An inverting path with sufficient gain will oscillate when connected in a ring, while a non-inverting path will simply lock on a particular starting logic level. The ring oscillator is essentially a series of stages, each stage having an intrinsic delay from input to output. The frequency of the ring oscillator output is a function of the total delay time of the series of stages. Such ring oscillators have been common in ASCIs and processors to determine the speed characteristics of a particular chip.

Devices of similar design track well across a semiconductor chip. That is, a ring oscillator built out of inverters that are designed with high speed logic performs "fast," all logic circuits on a particular chip utilizing similar high-speed logic will also perform "fast." Some variation may be expected and the variation can be quantified in any given process. Placement of several ring oscillators at different areas of a chip design allows the designer to account for "cross chip" variations in performance. In very localized regions of a chip, parameters such as channel lengths track extremely well from one FET to another. Tracking of parameters between FETs at widely separated areas on a chip do not track as well as FETs that are very close. However, even FETs that are widely separated on a chip track better than chips processed on different wafers produced on different process lots, or even the same process lot.

Knowing the speed characteristics of a particular chip is valuable in order that the chip can be categorized as, for example, "fast," "nominal," or "slow". Fast products are often more valuable than nominal or slow products. Such speed differentiation is sometimes known as "speed sorting" or "bucketing."

Magnetic tunnel junction (MTJ) elements used in magnetoresistive random access memory (MRAM) devices include a first magnetic layer, a second magnetic layer and a non-magnetic layer positioned between the first and second magnetic layers. The first and second magnetic layers can be ferromagnetic layers while the non-magnetic layer can be an insulator layer such that current can tunnel through the non-magnetic layer between the first and second magnetic layers. Such MTJ structures are known to those skilled in the art. As also known to those skilled in the art, the structure and number of layers in a MTJ element that is part of a chip or memory device can include additional layers and/or the layers of the MTJ element and the chip can be formed from a variety of materials. Various manufacturing processes can also be used to make a MTJ element. The MTJ element will have a unique tunneling path through the non-magnetic layer and between the first and second magnetic layers. Because of the nature and structure of magnetic tunnel junction (MTJ) elements, the current that tunnels through such devices and its relationship to the switching characteristics is unique to each MTJ element even when such elements are manufactured in the same facility.

The increasing use of MRAM devices makes it increasingly important to be able to understand and properly characterize the switching characteristics of MTJ elements in MRAM devices at fast time scales. More specifically, there is a need to be able to efficiently characterize the performance of MTJ elements in real product like environments. Currently, such characterization is done by applying pulses from external pulse sources in a functional test environment. Besides involving complex logistics and expensive test equipment, this potentially introduces unwanted parasitics that can skew the results.

More specifically, current bit error rate testing methodology utilizes a functional tester with externally applied timing pulses. This involves complex logistics using expensive automatic test equipment (ATE) and can potentially, introduce parasitics that alter the results.

SUMMARY

Accordingly, there is a need for apparatus and methods suitable for analyzing and characterizing the performance of magnetic tunnel junction (MTJ) elements used in magnetoresistive random access memory (MRAM) devices. The present invention relates to the testing and characterization of magnetic tunnel junction (MTJ) elements suitable for use with such magnetoresistive random access memory (MRAM) devices.

In an embodiment of the present invention, apparatus is provided to test and characterize magnetic tunnel junction (MTJ) elements. Such MTJ elements can be suitable for use in magnetoresistive random access memory (MRAM) devices.

In one embodiment of the present invention, ring oscillators loaded with MTJ elements are used to characterize magnetic tunnel junction (MTJ) performance.

In particular, changes in the characteristics of the ring oscillator are used to obtain and understand the switching characteristics of MTJ elements. Because the fundamental timing is created on the chip by the natural switching characteristics of inverters (which are designed to be faster than the switching of the MTJ element), the present invention allows for the use of more simplified equipment and can reduce or eliminate external parasitics in the characterization of magnetic tunnel junction (MTJ) elements.

Thus, in an embodiment of the present invention, a circuit is provided for characterizing switching characteristics of a magnetic tunnel junction (MTJ) element. The circuit includes an odd number of inverters connected in series (i.e., a chain), wherein each inverter forms a stage; and a plurality of magnetic tunnel junction elements configured such that a magnetic tunnel junction element is connected between each of the inverter stages, wherein the inverter stages and the plurality of the magnetic tunnel junction elements are configured in a ring oscillator (RO).

In another embodiment of the present invention, an alternative circuit is provided for characterizing switching characteristics of a magnetic tunnel junction (MTJ) element. The circuit includes an odd number of inverters connected in series, wherein each inverter forms a stage; a plurality of magnetic tunnel junction elements configured such that a magnetic tunnel junction element is connected between each of the inverter stages, wherein the inverter stages and the plurality of the magnetic tunnel junctions are configured in a ring oscillator (RO); a time to amplitude converter electrically connected to the ring oscillator; a pulse distribution analyzer electrically connected to the amplitude converter; and optionally a plurality of PFETs and NFETs configured such that a PFET and NFET are electrically connected to each of the magnetic tunnel junction (MTJ) elements and to a subsequent inverter in the ring oscillator (RO).

In yet another embodiment of the present invention, a method for characterizing switching characteristics of a magnetic tunnel junction (MTJ) element includes providing a circuit. The circuit includes an odd number of inverters connected in series, wherein each inverter forms a stage; and a plurality of magnetic tunnel junction elements configured such that a magnetic tunnel junction element is connected between each of the inverter stages, wherein the inverters and magnetic tunnel junction elements are configured in a ring oscillator (RO). The method further includes applying a voltage to the circuit such that stable oscillations are obtained in the RO. The applied voltage is used to generate data on the switching characteristics of the magnetic tunnel junction (MTJ) as a function of the applied voltage. In alternative embodiments, a magnetic field can also be applied to the circuit to generate additional characteristics on the magnetic tunnel junction (MTJ) elements.

In still another embodiment of the present invention, a method for characterizing switching characteristics of a magnetic tunnel junction (MTJ) element includes providing a circuit. The circuit includes an odd number of inverters connected in series, wherein each inverter forms a stage; and a plurality of magnetic tunnel junction elements configured such that a magnetic tunnel junction element is connected between each of the inverter stages, wherein the inverters and magnetic tunnel junction elements are configured in a ring oscillator (RO). The method further includes applying a voltage and varying magnetic field to the circuit (i.e. different external magnetic fields applied across the chip) to characterize the circuit during the varying magnetic field. The characterization is used to generate data on the switching characteristics of the magnetic tunnel junction (MTJ) elements as a function of the varying magnetic field. In some embodiments, the magnetic field can be varied or swept from a positive value, for example 3000 Oersted (Oe) to −3000 Oersteds (Oe) in increments or steps of 100 Oe. These variations in the external magnetic fields can provide significant information about the nature of the MTJ elements.

In yet a further embodiment of the present invention, a method for making a circuit for characterizing magnetic tunnel junction (MTJ) elements is provided. The method includes electrically connecting an odd number of inverters to a plurality of magnetic tunnel junction (MTJ) elements such that the inverters and the plurality of magnetic tunnel junction elements are connected in series and a magnetic tunnel junction element is positioned between two consecutive inverters, wherein the inverters and the plurality of the magnetic tunnel junction elements form a ring oscillator (RO) configured to characterize the performance of the magnetic tunnel junction elements; optionally electrically connecting a time to amplitude converter to the ring oscillator (RO); and optionally electrically connecting a pulse distribution analyzer to the time to amplitude converter.

In each of the embodiments, the plurality of magnetic tunnel junction elements can be used as elements of a magnetoresistive random access memory (MRAM) device.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As indicated hereinabove, the present invention generally relates to characterization for magnetoresistive random access memory (MRAM) devices. The present invention more specifically relates to the characterization of the performance of magnetic tunnel junction (MTJ) elements loaded in ring oscillators, which are now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, "mount" includes join, unite, couple, associate, insert, hang, affix, attach, fasten, bind, paste, secure, bolt, screw, rivet, pin, nail, clasp, clamp, cement, fuse, solder, weld, glue, form over, form on, slide together, layer, deposit, sputter, and similar terms. "Mounted on" and "mounted to" include any interior or exterior portion of the referenced element. Such phrases also include direct mounting (i.e. where the referenced elements are in direct contact) and indirect mounting (in which the referenced elements are not in direct contact, but are mounted together using intermediate elements. Elements referenced as mounted together herein may also be integrally formed together, for example, using a molding process as understood by a person skilled in the art. As a result, elements described herein as being mounted to each other need not be discrete structural elements. The elements may be permanently mounted, removably mounted or releasably mounted.

The magnetic tunnel junction (MTJ) elements loaded in ring oscillators of the present invention allow for intrinsic characterization of the performance of MTJ elements. Such performance data can be useful for characterizing the MTJ elements as relatively "fast", "nominal", or "slow". Fast product can often be sold for a higher price than a nominal or slow product, thus making it important to know the speed characteristics. As mentioned above, such speed differentiation is sometimes known as "speed sorting" or "bucketing". The performance characteristics of MTJ elements can be useful in various technologies that utilize and include such MTJ elements, for example in magnetoresistive random access memory (MRAM) technologies.

Given the increasing use of MRAM technologies, being able to characterize and model switching characteristics of MTJ elements in a real product like environment can be very beneficial. The circuits of the present invention that use a ring oscillator facilitate the understanding and modeling of the switching characteristics of MTJ elements in a less complex testing environment relative to prior MTJ element testing arrangements. For example, the apparatus and methods of the present invention allow for modeling and characterization of MTJ elements to be accomplished without the necessity of advanced functional characterization equipment. In addition, parasitics due to the connection of external test equipment can be reduced or eliminated in the present invention. The use of less complex characterization equipment in accordance with the present invention therefore facilitates ease of implementation in products and reduces complex parametric testing.

Accordingly and as mentioned hereinabove, disclosed herein are circuits that include a ring oscillator (RO) having an odd number of inverters connected in series with a plurality of magnetic tunnel junction elements, with a magnetic tunnel junction element inserted between each of the inverter stages. Such configuration allows for the use of more simplified parametric test equipment together with existing complementary metal oxide semiconductor (CMOS) circuit elements.

In other embodiments, the magnetic tunnel junction elements can be configured between the inverter stages so as to act as a load for the inverter stages. These configurations can provide an alternative method of understanding the switching characteristics of the MTJ elements that complement the information obtained by other, series connected, configurations.

In yet other embodiments of the present invention, the ring oscillators of the present invention can be tunable, for example by using changes in applied voltage (Vdd) to the circuit, by using different numbers of stages to obtain different frequencies or by using a combination of changes in Vdd and different numbers of stages to obtain different frequencies. The frequency of the ring oscillator, f, can be designed to be determined by $R_{MTJ} \times C_{in}$, where f is the frequency of the ring oscillator, $R_{MTJ}$ is the resistance of the MTJ and $C_{in}$, is the inverter capacitance.

In some alternative embodiments of the present invention, the ring oscillators of the present invention can be used in conjunction with an external field (i.e., an external magnetic field) to facilitate and improve design features of MTJ elements. More specifically, an external magnetic field can be applied to the circuit to modulate the switching characteristics of the MTJ elements. The relationship between the switching characteristics and the applied field facilitates improved and optimal design characteristics and features of MTJ elements.

In yet other alternative embodiments of the present invention, a PFET (p-type or p-channel field effect transistor) and a NFET (n-type or n-type field effect transistor) may optionally be included between the magnetic tunnel junction (MTJ) elements and the next inverter stage to ensure sufficient current is flowing through the MTJ elements to be able to switch. More specifically, the optional inclusion of a PFET and NFET can be introduced between the stages to control the magnitude and time of current flowing through a MTJ element at any given time.

In yet other alternative embodiments of the present invention, the circuits may optionally include a time to amplitude converter, a pulse distribution analyzer or both a time to amplitude converter and a pulse distribution analyzer as integral parts of the circuitry. The inventive structure, as described below, thus allows for more efficient characterization of MTJ elements that can be used in MRAM devices. The structures of various embodiments disclosed herein are described in detail below.

Figure 1:
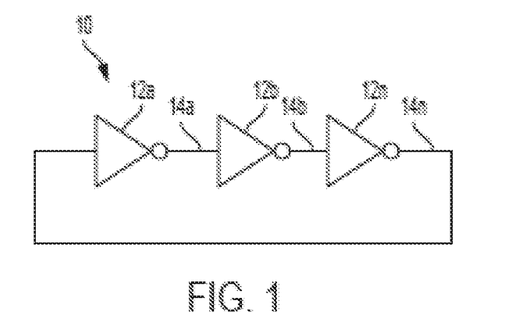
FIG. 1 illustrates a conventional ring oscillator with (2n+1) inverters.

Referring now to FIG. 1, a conventional ring oscillator (RO) 10 is illustrated. Ring oscillator (RO) 10 can include a number of inverters 12a, 12b . . . 12n connected in series. Ring oscillator (RO) 10 is formed in the shape of a ring as shown in FIG. 1 such that the output 14a, 14b . . . 14n of respective inverter 12a, 12b . . . 12n is the input of the next inverter in the series. As can be seen, the ring structure of ring oscillator (RO) 10 allows output 14n of inverter 12n to become input to inverter 12a. Ring oscillator (RO) 10 can include (2n+1) inverters, where n is an integer, typically ranging from 1-100. Each inverter 12 in ring oscillator (RO) 10 includes NFET and PFETs that have a characteristic switching speed (not shown in FIG. 1) or delay.

Figure 2:
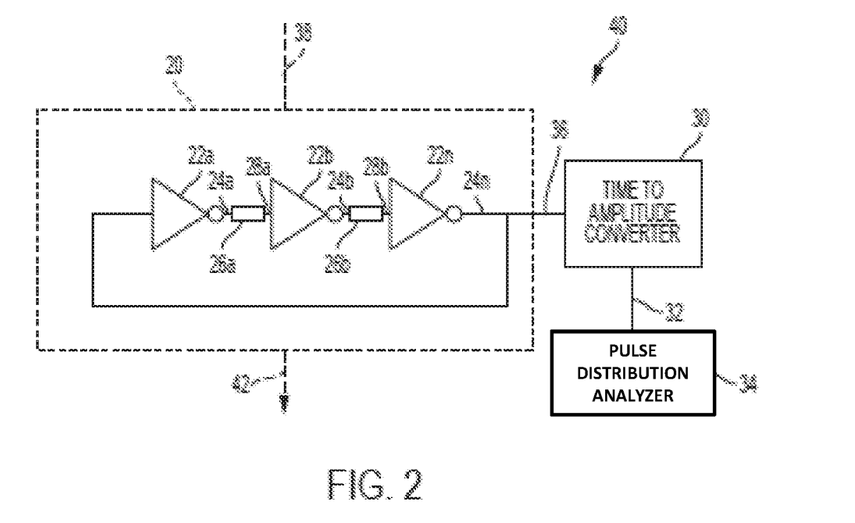
FIG. 2 illustrates a circuit configuration arranged for characterizing the performance of magnetic tunnel junction (MTJ) elements, the circuit configuration also optionally including a time to amplitude converter and/or a pulse distribution analyzer.

FIG. 2 illustrates a circuit 40 in accordance with an embodiment of the present invention. Circuit 40 is arranged to allow for characterization of performance of magnetic tunnel junction (MTJ) MTJ elements. More specifically, circuit 40 can be used to generate data on the switching characteristics of the MTJ elements in the circuit.

Circuit 40 includes ring oscillator (RO) 20. Ring oscillator (RO) 20 includes an odd number of inverters 22a, 22b . . . 22n connected in series. The number of inverters 22a, 22b . . . 22n in circuit 40 is (2n+1) inverters, where n is an integer, typically ranging from 1-100. Each inverter 22a, 22b . . . 22n in ring oscillator (RO) 20 can include NFET and PFETs that have a characteristic switching speed (not shown in FIG. 2) or delay. The odd number of inverters in circuit 40 ensures that the ring oscillator oscillates.

Ring oscillator (RO) 20 also includes a plurality of magnetic tunnel junction (MTJ) elements 26a, 26b . . . 26n (not shown in FIG. 2). As can further be seen from FIG. 2, a magnetic tunnel junction (MTJ) element of the plurality of magnetic tunnel junction (MTJ) elements 26a, 26b . . . 26n (not shown in FIG. 2) is connected in series between each inverter stage 22a, 22b . . . 22n.

The additional inclusion of the MTJ elements changes the delay to $R_{MTJ} \times C_{in}$, wherein $R_{MTJ}$ is the resistance of the MTJ and $C_{in}$ is the input capacitance of the inverter. This corresponds to a change in the frequency with increasing delay resulting in the reduction of the frequency. Depending on the state of the MTJ, it can have two distinct resistance values and hence pulses in the oscillator have two characteristic frequencies. If the MTJ switches with every cycle it will result in a pulse height distribution that is symmetric. If the MTJ fails to switch from the low resistance state to higher resistance state ("stuck low") the curve will skew towards lower resistance and vice versa.

The outputs of each inverter provide the input to the next MTJ element in the series of ring oscillator (RO) 20. The output of each MTJ element then provides the input to the next inverter in the series of ring oscillator (RO 20). Thus, for example and as shown in FIG. 2, outputs 24a, 24b of respective inverters 22a, 22b are respective inputs to MTJ elements 26a, 26b. MTJ element output 28a is the input to inverter 22b and MTJ element output 28b is the input to next inverter in the series, (shown as inverter 22n in FIG. 2). The output 24n of the last inverter in the series, inverter 22n as shown in FIG. 2, provides the input to first inverter 22a in ring oscillator (RO) 20.

In some embodiments, the number of magnetic tunnel junction (MTJ) elements is one less than one the number of inverters, as illustrated in FIG. 2. More specifically, some embodiments of the present invention will not include a MTJ element following inverter 22n. In alternative embodiments, a MTJ element can be included following inverter 22n and output 24n of inverter 22n can be the input to such MTJ element (not shown in FIG. 2). In this arrangement, the output of such MTJ element then provides the input to first inverter 22a.

When a voltage (Vdd) 38 is applied to ring oscillator 20, the oscillator oscillates, i.e., stream(s) of pulses are seen at the output. It will be appreciated that the voltage (Vdd) 38 can be applied to each inverter stage, but is illustrated in FIG. 2 as being applied to the ring oscillator (RO) 20. Ring oscillator (RO) 20 is also connected to ground 42. It will be appreciated that the connection to ground 42 can be at each inverter stage, but is illustrated in FIG. 2 as being applied to the ring oscillator (RO) 20.

Circuit 40 illustrated in FIG. 2 can further optionally include time to amplitude converter 30 electrically coupled or electrically connected to ring oscillator (RO) 20 via 36. Converter 30 is a time to amplitude converter and can be designed using standard circuit elements. Such converters convert the inter-arrival time between pulses into pulse amplitudes.

Figure 5:
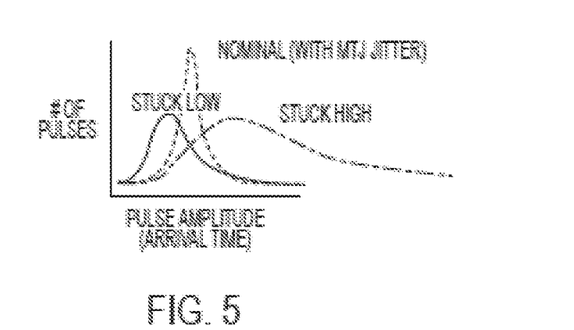
FIG. 5 is a graph illustrating pulse amplitude (arrival time) vs. number of pulses in accordance with the present invention.

Circuit 40 can also further optionally include pulse distribution analyzer 34 electrically coupled or electrically connected to time to amplitude converter 30 via 32. Pulse distribution analyzer 34 can be constructed out of standard circuit elements so that the pulse amplitudes coming out of the converter 30 can be readily analyzed as a distribution function. The arrangement illustrated in FIG. 2 allows for the production or generation of pulse distribution information. Such pulse distribution information can provide significant information regarding the characterization of the MTJ elements. For example and as discussed in greater detail herein, the configuration shown in FIG. 2 allows for production of pulse height distribution information such as shown in FIG. 5.

Ring oscillator (RO) 20 and circuit 40 (optionally, including time to amplitude converter 30 and/or pulse distribution analyzer 34 as a part thereof) can be tunable. For example, RO 20 can be tunable either by a change in voltage, by a change in the number of oscillators or a combination of both a change in voltage and a change in the number of oscillators.

Figure 3:
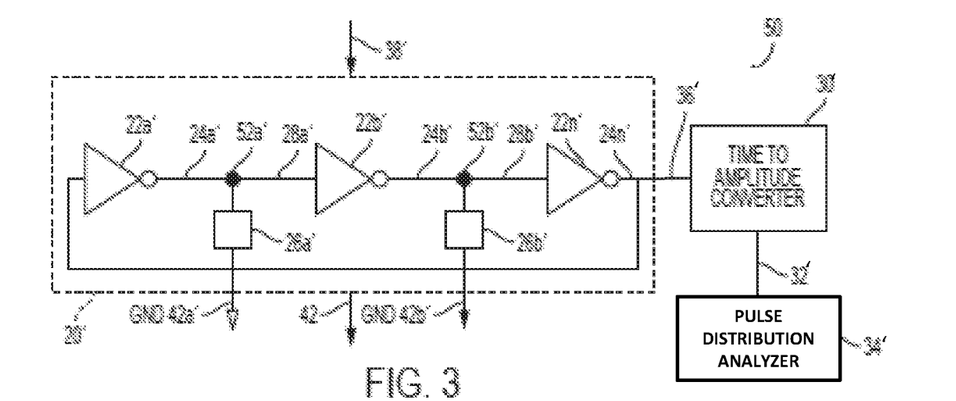
FIG. 3 illustrates an alternative circuit configuration arranged for characterizing the performance of magnetic tunnel junction (MTJ) elements, the configuration arranged such that the MTJ elements act as a load to the inverters, the circuit configuration also optionally including a time to amplitude converter and/or a pulse distribution analyzer.

In other embodiments of the present invention, performance or switching characteristics of MTJ elements can be analyzed using alternative arrangements of the MTJ elements relative to the inverter stages. With reference now to FIG. 3, a circuit 50 in accordance with an alternative embodiment of the present invention is illustrated. Circuit 50 is arranged to allow for characterization of performance of magnetic tunnel junction (MTJ) elements. More specifically, circuit 50 can be used to generate data on the switching characteristics of the MTJ elements in the circuit.

As mentioned above with reference to circuit 40, circuit 50 includes ring oscillator (RO) 20'. Ring oscillator (RO) 20' includes an odd number of inverters 22a', 22b' . . . 22n' connected in series. The number of inverters 22a', 22b' . . . 22n' in circuit 50 is (2n+1) inverters, where n is an integer, typically ranging from 1-100. Each inverter 22a', 22b' . . . 22n' in ring oscillator (RO) 20' can include NFET and PFETs that have a characteristic switching speed (not shown in FIG. 3) or delay. The odd number of inverters in circuit 50 ensures that the ring oscillator oscillates.

Ring oscillator (RO) 20' also includes a plurality of magnetic tunnel junction (MTJ) elements 26a', 26b' . . . 26n' (not shown in FIG. 3). As can further be seen from FIG. 3, a magnetic tunnel junction (MTJ) element of the plurality of magnetic tunnel junction (MTJ) elements 26a', 26b' . . . 26n' (not shown in FIG. 3) is connected between each inverter stage 22a', 22b' . . . 22n'. More specifically, MTJ elements 26a', 26b' . . . 26n' (not shown in FIG. 3) are connected between the respective inverters at intermediate nodes 52a', 52b' . . . 52n' (not shown in FIG. 3). In the arrangement shown in FIG. 3, the MTJ elements 26a', 26b' . . . 26n' (not shown in FIG. 3) are arranged to behave or act as a load to the inverter.

As discussed above in connection with FIG. 2, the additional inclusion of the MTJ changes the delay to $R_{MTJ} \times C_{in}$, wherein $R_{MTJ}$ is the resistance of the MTJ and $C_{in}$ is the input capacitance of the inverter. Depending on the state of the MTJ, it can have two distinct resistance values and hence pulses in the oscillator have two characteristic frequencies. If the MTJ switches with every cycle it will result in a pulse height distribution that is symmetric. If the MTJ fails to switch from the low resistance state to higher resistance state ("stuck low") the curve will skew towards lower resistance and vice versa.

The outputs of each inverter provide the input to the next MTJ element in the series of ring oscillator (RO) 20'. The output of each MTJ element then provides the input to the next inverter in the series of ring oscillator (RO) 20'. Thus, for example and as shown in FIG. 3, outputs 24a', 24b' of respective inverters 22a', 22b' are respective inputs to MTJ elements 26a', 26b'. MTJ element output 28a' is the input to inverter 22b' and MTJ element output 28b' is the input to next inverter in the series (shown as inverter 22n' in FIG. 3). The output 24n' of the last inverter in the series, inverter 22n' as shown in FIG. 3, provides the input to first inverter 22a' in ring oscillator (RO) 20'.

In some embodiments, the number of magnetic tunnel junction (MTJ) elements is one less than one the number of inverters, as illustrated in FIG. 3. More specifically, some embodiments of the present invention will not include a MTJ element following inverter 22n'. In alternative embodiments, a MTJ element can be included following inverter 22n' and output 24n' of inverter 22n' can be the input to such MTJ element (not shown in FIG. 3). In this arrangement, the output of such MTJ element then provides the input to first inverter 22a'.

When a voltage (Vdd) 38' is applied to ring oscillator 20', the oscillator oscillates, i.e., stream(s) of pulses are seen at the output. It will be appreciated that the voltage (Vdd) 38' can be applied to each inverter stage, but is illustrated in FIG. 2 as being applied to the ring oscillator (RO) 20'. Ring oscillator (RO) 20' is also connected to ground 42. It will be appreciated that the connection to ground 42 can be at each inverter stage, such as ground connection 42a' and ground connection 42b' as illustrated in FIG. 3.

Circuit 50 illustrated in FIG. 3 can further optionally include time to amplitude converter 30' electrically coupled or electrically connected to ring oscillator (RO) 20' via 36'. Converter 30' is a time to amplitude converter and can be designed using standard circuit elements. Such converters convert the inter-arrival time between pulses into pulse amplitudes.

Circuit 50 can also further optionally include pulse distribution analyzer 34' electrically coupled or electrically connected to time to amplitude converter 30' via 32'. Pulse distribution analyzer 34' can be constructed out of standard circuit elements so that the pulse amplitudes coming out of the converter 30' can be readily analyzed as a distribution function. The arrangement illustrated in FIG. 3 allows for the production or generation of pulse distribution information. Such pulse distribution information can provide significant information regarding the characterization of the MTJ elements. For example and as discussed in greater detail herein, the configuration shown in FIG. 3 allows for production of pulse height distribution information such as shown in FIG. 5.

Ring oscillator (RO) 20' and circuit 50 (optionally, including time to amplitude converter 30' and/or pulse distribution analyzer 34' as a part thereof) can be tunable. For example, ring oscillator (RO) 20' can be tunable either by a change in voltage, by a change in the number of oscillators or a combination of both a change in voltage and a change in the number of oscillators.

Figure 4:
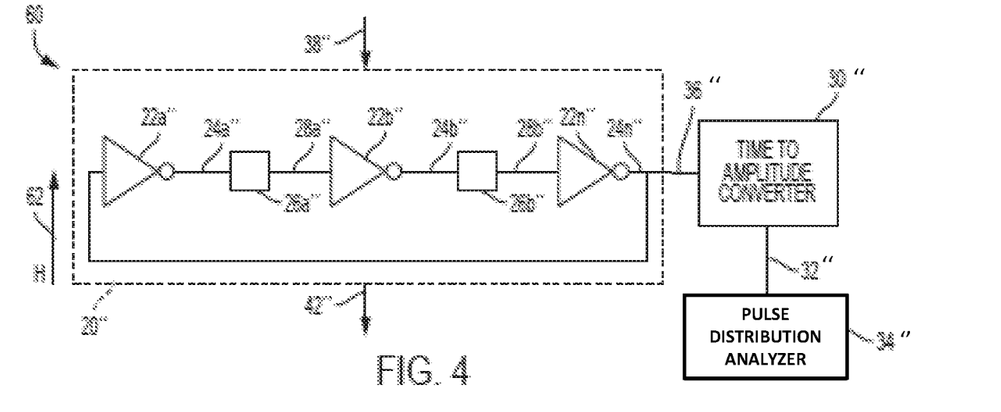
FIG. 4 illustrates application of an external magnetic field across the magnetic tunnel junction (MTJ) elements using the arrangement shown in FIG. 2.

In other embodiments of the present invention, performance or switching characteristics of MTJ elements can be analyzed using external magnetic fields applied to the circuit. Such an arrangement is illustrated in FIG. 4. Circuit 60 is also arranged to allow for characterization of performance of magnetic tunnel junction (MTJ) elements. More specifically, circuit 60 can be used to generate data on the switching characteristics of the MTJ elements in the circuit. Circuit 60 is similar to circuit 40 shown in FIG. 2, but includes the use of an applied external magnetic field (H), shown as 62 in FIG. 4.

Circuit 60 includes ring oscillator (RO) 20". Ring oscillator (RO) 20" includes an odd number of inverters 22a", 22b" . . . 22n" connected in series. The number of inverters 22a", 22b" . . . 22n" in circuit 60 is (2n+1) inverters, where n is an integer, typically ranging from 1-100. Each inverter 22a", 22b" . . . 22n" in ring oscillator (RO) 60 can include NFET and PFETs that have a characteristic switching speed (not shown in FIG. 4) or delay. The odd number of inverters in circuit 60 ensures that the ring oscillator oscillates.

Ring oscillator (RO) 60 also includes a plurality of magnetic tunnel junction (MTJ) elements 26a", 26b" . . . 26n" (not shown in FIG. 4). As can further be seen from FIG. 4, a magnetic tunnel junction (MTJ) element of the plurality of magnetic tunnel junction (MTJ) elements 26a", 26b" . . . 26n" (not shown in FIG. 4) is connected in series between each inverter stage 22a", 22b" . . . 22n".

As mentioned above, the additional inclusion of the MTJ changes the delay to $R_{MTJ} \times C_{in}$, wherein $R_{MTJ}$ is the resistance of the MTJ and $C_{in}$ is the input capacitance of the inverter. Depending on the state of the MTJ, it can have two distinct resistance values and hence pulses in the oscillator have two characteristic frequencies. If the MTJ switches with every cycle it will result in a pulse height distribution that is symmetric. If the MTJ fails to switch from the low resistance state to higher resistance state ("stuck low") the curve will skew towards lower resistance and vice versa.

The outputs of each inverter provide the input to the next MTJ element in the series of ring oscillator (RO) 20". The output of each MTJ element then provides the input to the next inverter in the series of ring oscillator (RO) 20". Thus, for example and as shown in FIG. 4, outputs 24a", 24b" of respective inverters 22a", 22b" are respective inputs to MTJ elements 26a", 26b". MTJ element output 28a" is the input to inverter 22b" and MTJ element output 28b" is the input to next inverter in the series, shown as inverter 22n" in FIG. 2. The output 24n" of the last inverter in the series, inverter 22n" as shown in FIG. 4, provides the input to first inverter 22a" in ring oscillator (RO) 20".

In some embodiments, the number of magnetic tunnel junction (MTJ) elements is one less than one the number of inverters, as illustrated in FIG. 4. More specifically, some embodiments of the present invention will not include a MTJ element following inverter 22n". In alternative embodiments, a MTJ element can be included following inverter 22n" and output 24n" of inverter 22n" can be the input to such MTJ element (not shown in FIG. 4). In this arrangement, the output of such MTJ element then provides the input to first inverter 22a".

When a voltage (Vdd) 38" is applied to ring oscillator 20", the oscillator oscillates, i.e., stream(s) of pulses are seen at the output. When an external magnetic field (H) 62 is applied to ring oscillator 20", the oscillator also oscillates, i.e., stream(s) of pulses are seen at the output. It will be appreciated that the voltage 38" and magnetic field (H) 62 can be applied to each inverter stage, but are illustrated in FIG. 4 as being applied to the ring oscillator (RO) 20". Ring oscillator (RO) 20" is also connected to ground 42". It will be appreciated that the connection to ground 42" can be at each inverter stage, but is illustrated in FIG. 4 as being applied to the ring oscillator (RO) 20". The embodiment illustrated in FIG. 4 allows for additional characterization and performance analysis of the switching characteristics of MTJ elements for different external magnetic fields applied across the chip. The magnetic field 62 can be applied or swept across varying ranges. For example and while not to be construed as limiting, the magnetic field can be applied from a positive value, for example 3000 Oersted (Oe) to −3000 Oersteds (Oe) in increments or steps of 100 Oe. The applied variations allow for detailed characterization of the performance of the MTJ elements.

Circuit 60 illustrated in FIG. 4 can further optionally include time to amplitude converter 30" electrically coupled or electrically connected to ring oscillator (RO) 20" via 36". Converter 30" is a time to amplitude converter and can be designed using standard circuit elements. Such converters convert the inter-arrival time between pulses into pulse amplitudes.

Circuit 60 can also further optionally include pulse distribution analyzer 34" electrically coupled or electrically connected to time to amplitude converter 30" via 32". Pulse distribution analyzer 34" can be constructed out of standard circuit elements so that the pulse amplitudes coming out of the converter 30" can be readily analyzed as a distribution function. The arrangement illustrated in FIG. 4 allows for the production or generation of pulse distribution information. Such pulse distribution information can provide significant information regarding the characterization of the MTJ elements. For example and as discussed in greater detail herein, the configuration shown in FIG. 4 allows for production of pulse height distribution information such as shown in FIG. 5. The magnetic field can shift the curves and change the skew in the curves. This can be useful for optimization of the MTJ and its switching characteristics.

Ring oscillator (RO) 20" and circuit 60 (optionally, including time to amplitude converter 30" and/or pulse distribution analyzer 34" as a part thereof) can be tunable. For example, ring oscillator (RO) 20" can be tunable either by a change in voltage, by a change in the number of oscillators or a combination of both a change in voltage and a change in the number of oscillators. The applied magnetic field can facilitate characterization based on a change in the switching of the MTJs for a given number of stages and/or voltage.

While an externally applied magnetic field (H) has been described with reference to the arrangement and configuration shown in FIG. 4, magnetic fields can be applied using other embodiments of the present invention. For example and for purposes of illustration, an externally applied magnetic field could be used in addition to the applied voltage 38' in the configuration illustrated in FIG. 3. The magnetic field can provide additional information about the switching characteristics of the MTJ elements and enable optimization of switching characteristics and improved design.

In use, the ring oscillators (for example ring oscillator 20 in FIG. 2, ring oscillator 50 in FIG. 3, ring oscillator 60 in FIG. 4) of the present invention operate at a frequency, f. The frequency of the ring oscillators can be monitored and is related to the speed of the inverters in the ring oscillators. Characteristic frequency tools are known and can be used to tell the speed of each of the inverters in the ring oscillators.

The analysis of switching characteristics of the MTJ, in the past, have depended on the use of detailed parametric testing utilizing advanced functional test equipment. The present invention, however, recognizes that the frequency of the ring oscillator, f, can be determined by $R_{MTJ} \times C_{in}$, where f is the frequency of the ring oscillator, $R_{MTJ}$ is the resistance of the magnetic tunnel junction (MTJ) element and $C_{in}$, is the inverter capacitance. The arrangement illustrated in FIG. 2 thus allows for the modeling and understanding of the switching characteristics of MTJ elements in a reliable and more simplified manner. Rather than focusing on ring speed, a time to amplitude converter (such as converter 30) can be used to analyze pulse data exiting the converter and generate pulse distribution data (time between each pulse). In this manner, switching characteristics of the MTJ elements can be obtained.

FIG. 5 is a graph illustrating pulse amplitude (arrival time) vs. number of pulses in accordance with the present invention. More specifically, pulse distribution data (time between each pulse) can be generated and plotted to determine the nature of a distribution. As shown in FIG. 5 for example, a nominal distribution (with magnetic tunnel junction (MTJ) jitter) can indicate good magnetic tunnel junction (MTJ) performance and therefore good ring oscillator (RO) performance. If the magnetic tunnel junction (MTJ) elements are performing inadequately, deviation from an acceptable distribution can then be observed. For example and referring again to FIG. 5, if performance of the magnetic tunnel junction (MTJ) elements are stuck low or stuck high, changes in the pulse distribution can be observed. The effect of the externally applied magnetic field on the switching characteristics can also be studied and this enables further optimization of the MTJ.

Such deviations allow for the characterization of the MTJ elements as "fast", "slow" or "nominal". Changes in the MTJ elements can accordingly be made for inclusion in MRAM devices or other technologies utilizing MTJ elements as appropriate. It is therefore possible to analyze the switching of MTJ elements in a real product-like environment. The arrangements of the present invention accordingly allow for the characterization of MTJ elements in a less complex manner relative to prior techniques for such characterization. For example, the arrangements of the present invention allows for such characterization without the necessity of advanced functional characterization equipment. In addition, parasitics due to the connection of external test equipment can be reduced or eliminated in the present invention. Moreover, testing and characterization can be conducted on a more intrinsic, less parametric testing basis rather than a complex and functional basis. The arrangements of the present invention further allow for the use of simplified parametric test equipment together with existing complementary metal oxide semiconductor (CMOS) circuit elements.

As mentioned above, the MTJ elements that can be characterized in accordance with the present invention can be elements of a magnetoresistive random access memory (MRAM) device. Contrary to current technologies that involve a functional digital circuit with complex testing equipment, the present invention accordingly provides characterization capabilities on an intrinsic basis.

It is believed that the fundamental timing created on the chip by the natural switching characteristics of inverters (which are significantly faster than the switching of the MTJ), allows for the use of more simplified equipment in accordance with the present invention. Such arrangements can reduce or eliminate external parasitics relative to existing technologies in the characterization of magnetic tunnel junction (MTJ) elements.

Figure 6:
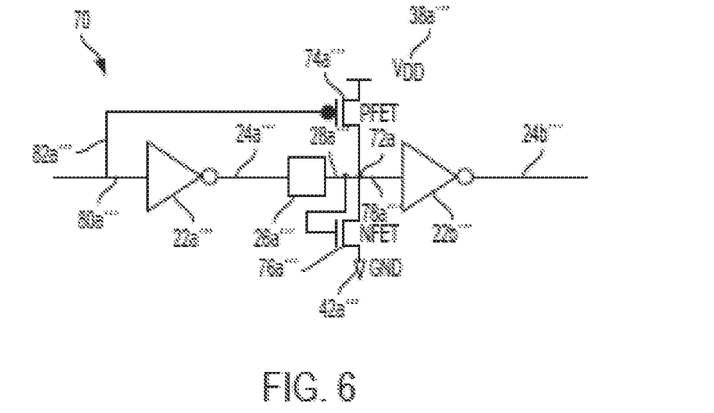
FIG. 6 illustrates a portion of an alternative embodiment of the present invention that includes a PFET (p-type or p-channel field effect transistor) and NFET (n-type or n-type field effect transistor) introduced between the inverter stages to facilitate control of the magnitude and time of current flowing through a magnetic tunnel junction (MTJ) element at a given time.

In accordance with another embodiment of the present invention, a PFET (p-type or p-channel field effect transistor) and NFET (n-type or n-type field effect transistor) can be used to facilitate control of the magnitude and time of current flowing through a magnetic tunnel junction (MTJ) element at any time. More specifically, FIG. 6 illustrates a portion of an alternative embodiment of the present invention that includes a PFET (p-type or p-channel field effect transistor) and NFET (n-type or n-type field effect transistor) introduced between the inverter stages $22a'''$, $22b'''$ to facilitate control of the magnitude and time of current flowing through a magnetic tunnel junction (MTJ) element at a given time. While two inverters are shown in FIG. 6, the number of inverters employed in the arrangement shown in FIG. 6 is an odd numbers of inverters and is (2n+1) inverters, where n is an integer, typically ranging from 1-100, as discussed above in connection with other embodiments. As further illustrated in FIG. 6, arrangement 70 includes PFET $74a'''$ (p-type or p-channel field effect transistor) and NFET $76a'''$ (n-type or n-type field effect transistor) following MTJ element $26a'''$ and before inverter stage $22b'''$. PFET $74a'''$ and NFET $76a'''$ facilitate the magnitude and timing of the current flowing through MTJ element $26a'''$ as well as controlling input $78a'''$ to inverter $22b'''$.

PFET $74a'''$ can be connected between the applied voltage $38a'''$ (Vdd, the voltage supplied to the oscillator) and intermediate node $72a$. NFET $76a'''$ can be connected between intermediate node $72a$ and ground $42a'''$. Outputs $24a'''$, $24b'''$ of respective inverters $22a'''$, $22b'''$ are respective inputs to MTJ elements $26a'''$, $26b$ (not shown in FIG. 6). MTJ element output $28a'''$ is input to inverter $22b$. The output of the last inverter in the series provides input to first inverter $22a'''$ in the ring oscillator. Inputs $80a'''$ and $82a'''$ are inputs to inverter $22a'''$ and PFET $74a'''$. The threshold voltage (Vt), channel length (L), and the width (W) of the transistors are selected such that sufficient current is available during each cycle to switch the MTJ element(s) and ensure stable switching of the MTJ and also enable stable operation of the oscillator.

While only one PFET and NFET is shown in FIG. 6, it can be appreciated by one skilled in the art using the disclosures provided by the present invention that additional PFETs and NFETs can be inserted following some or all of the MTJ elements in the ring oscillators of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit for characterizing switching characteristics of a magnetic tunnel junction element, the circuit comprising:
   an odd number of inverters connected in series, wherein each inverter forms a stage and comprises an output; and
   a plurality of magnetic tunnel junction elements configured such that a magnetic tunnel junction element is electrically connected between each of the inverter stages,
   wherein the inverter stages and the plurality of the magnetic tunnel junction elements are configured in a ring oscillator, and
   wherein the output of each inverter provides an input to the subsequent magnetic tunnel junction element in the ring oscillator.

2. The circuit of claim 1, wherein the number of inverters is (2n+1), wherein n is an integer between 1-100.

3. The circuit of claim 1, wherein a frequency of the ring oscillator is delayed by $R_{MTJ} \times C_{in}$, wherein $R_{MTJ}$ is the resistance of the magnetic tunnel junction element and $C_{in}$ is the input capacitance of the inverter.

4. The circuit of claim 1, further comprising a source of applied voltage to the ring oscillator.

5. The circuit of claim 1, wherein the plurality of the magnetic tunnel junction elements are connected in series with the inverters.

6. The circuit of claim 5, further comprising a PFET and a NFET connected after a magnetic tunnel junction element and before the next inverter in the series, the PFET further connected between the applied voltage source and an intermediate node and a NFET connected between the intermediate node and ground.

7. The circuit of claim 6, further comprising a PFET and a NFET connected after each of the magnetic tunnel junction elements and before the next inverter in the series, each of the PFETs further connected between the applied voltage source and an intermediate node and each of the NFETs connected between the intermediate node and ground.

8. The circuit of claim 5, further comprising a source of an external magnetic field to be applied to the ring oscillator.

9. The circuit of claim 1, wherein the plurality of the magnetic tunnel junction elements are connected to the inverters such that the magnetic tunnel junction elements act as a load to the inverters.

10. The circuit of claim 9, further comprising a source of applied voltage to the ring oscillator.

11. The circuit of claim 9, further comprising a source of an external magnetic field to be applied to the ring oscillator.

12. The circuit of claim 1, further comprising a time to amplitude converter electrically connected to the ring oscillator.

13. The circuit of claim 10, further comprising a pulse distribution analyzer electrically connected to the amplitude converter.

14. A circuit for characterizing switching characteristics of a magnetic tunnel junction, the circuit, comprising:
an odd number of inverters connected in series, wherein each inverter forms a stage and comprises an output;
a plurality of magnetic tunnel junction elements configured such that a magnetic tunnel junction element is electrically connected between each of the inverter stages, wherein the inverter stages and the plurality of the magnetic tunnel junctions are configured in a ring oscillator, and wherein the output of each inverter provides an input to the subsequent magnetic tunnel junction element in the ring oscillator;
a time to amplitude converter electrically connected to the ring oscillator;
a pulse distribution analyzer electrically connected to the amplitude converter; and
a plurality of PFETs and NFETs configured such that a PFET and NFET are electrically connected to each of the magnetic tunnel junction elements and to the subsequent inverter in the ring oscillator.

15. The circuit of claim 14, wherein a frequency of the ring oscillator is delayed by $R_{MTJ} \times C_{in}$, wherein $R_{MTJ}$ is the resistance of the magnetic tunnel junction element and $C_{in}$ is the input capacitance of the inverter.

16. A method for characterizing switching characteristics of a magnetic tunnel junction element, the method comprising:
providing a circuit, the circuit comprising:
an odd number of inverters connected in series, wherein each inverter forms a stage and comprises an output; and
a plurality of magnetic tunnel junction elements configured such that a magnetic tunnel junction element is electrically connected between each of the inverter stages, wherein the inverters and the magnetic tunnel junction elements are configured in a ring oscillator, and wherein the output of each inverter provides an input to the subsequent magnetic tunnel junction element in the ring oscillator; and
applying a voltage to the circuit to generate characteristics on the magnetic tunnel junction elements.

17. The method of claim 16, wherein the generating of characteristics on the magnetic tunnel junction elements comprises categorizing the magnetic tunnel junction elements as "fast", "slow" or "nominal".

18. The method of claim 16, further comprising applying a magnetic field to the circuit to generate additional characteristics on the magnetic tunnel junction elements.

19. The method of claim 18, wherein the generating of characteristics and the generating of the additional characteristics on the magnetic tunnel junction elements comprises categorizing the magnetic tunnel junction elements.

20. The method of claim 19, wherein the generating of characteristics on the magnetic tunnel junction elements comprises categorizing the magnetic tunnel junction elements as "fast", "slow" or "nominal".

* * * * *